(12) United States Patent
Hotaka

(10) Patent No.: US 7,213,120 B2
(45) Date of Patent: May 1, 2007

(54) CIRCUIT FOR PREVENTION OF UNINTENTIONAL WRITING TO A MEMORY, AND SEMICONDUCTOR DEVICE EQUIPPED WITH SAID CIRCUIT

(75) Inventor: Kazuo Hotaka, Hanyuu (JP)

(73) Assignee: Sanyo Electric Co., Ltd., Osaka (JP)

( * ) Notice: Subject to any disclaimer, the term of this patent is extended or adjusted under 35 U.S.C. 154(b) by 359 days.

(21) Appl. No.: 10/809,866

(22) Filed: Mar. 26, 2004

(65) Prior Publication Data
US 2004/0193817 A1    Sep. 30, 2004

(30) Foreign Application Priority Data
Mar. 26, 2003    (JP)    ............... 2003-084391

(51) Int. Cl.
*G06F 12/14* (2006.01)
(52) U.S. Cl. .............. 711/163; 711/100; 711/154; 711/156; 711/166; 710/200; 713/340; 714/22; 714/47
(58) Field of Classification Search ........... 711/163, 711/154, 100, 156, 166; 710/200; 713/340; 714/22, 47
See application file for complete search history.

(56) References Cited
U.S. PATENT DOCUMENTS 6,119,210 A * 9/2000 Leon et al. ............. 711/163
6,201,731 B1 * 3/2001 Kamp et al. .......... 365/185.02
6,556,504 B2 * 4/2003 Kwon et al. ........... 365/230.08
6,788,567 B2 * 9/2004 Fujimori ................ 365/154
2002/0103958 A1 * 8/2002 Kuwano ................. 711/103
2002/0129195 A1 * 9/2002 Hongo et al. ........... 711/104

FOREIGN PATENT DOCUMENTS

JP    08-095865    4/1996
JP    2002-366436    12/2002

\* cited by examiner

*Primary Examiner*—Stephen C. Elmore
*Assistant Examiner*—Daniel Kim
(74) *Attorney, Agent, or Firm*—Stephen B. Parker; Watchstone P+D, PLC

(57) ABSTRACT

A circuit for prevention of unintentional writing to a memory prevents unintentional writing to a nonvolatile memory, after a recovery from a transitory power failure. The circuit includes a low-voltage detection circuit for detecting a power supply voltage drop depending on the state of a control signal for the detection circuit. A writing operation to the memory is prohibited depending on the control signal as well as upon an output signal of the low-voltage detection circuit.

20 Claims, 6 Drawing Sheets

CIRCUIT FOR PREVENTION OF UNINTENTIONAL WRITING TO A MEMORY, AND SEMICONDUCTOR DEVICE EQUIPPED WITH SAID CIRCUIT

This application claims priority under 35 U.S.C. § 119 to Japanese Patent Application No. P2003-084391 filed on Mar. 26, 2003, the entire disclosure of which is incorporated herein by reference in its entirety.

BACKGROUND OF THE INVENTION

1. Field of the Invention

The present invention relates to a circuit for prevention of unintentional writing to a memory. More specifically, it relates to a circuit equipped with a low-voltage detection circuit capable of preventing unintentional writing to a nonvolatile memory when the low-voltage detection circuit detects a drop in power supply voltage. The present invention also relates to a semiconductor device equipped with such circuit.

2. Description of the Background

The following description sets forth the inventor's knowledge and should not be construed as an admission that the description constitutes prior art.

A nonvolatile memory, such as an EPROM, an EEPROM and a flash memory capable of erasing stored data in blocks instead of one byte at a time, can retain stored data even when the power supply voltage is turned off. Consequently, nonvolatile memory commonly is used in devices such as microcomputers to store programs such as BIOS, so that the programs can be easily updated to fix problems or bugs discovered during evaluation and use.

However, even though it is able to retain stored data when power is turned off, a nonvolatile memory becomes unstable in operation when power is first turned on or when the power supply VDD experiences transient drops in voltage. This is because a nonvolatile memory such as a flash memory has charges flowing into a floating gate, and sufficient charges cannot flow into the floating gate in the state of a low power supply voltage. As a result, the prescribed data holding characteristics cannot be assured. To overcome such a problem, a low-voltage detection circuit conventionally is provided, which directly resets the state of the nonvolatile memory itself.

The low-voltage detection circuit detects a drop in power supply voltage (such as when power is first turned on, or as a consequence of "noise" in the power supply), and automatically sends a reset signal to a writing/reading control portion of the nonvolatile memory. Thus, in a situation where the power supply voltage VDD is low, writing of data to the memory is prohibited. As a result, writing to the nonvolatile memory will be performed only when it is appropriate to execute the writing operation.

In recent years, as mentioned above, nonvolatile memories have been used in many devices, including microcomputers. The microcomputer and the nonvolatile memory conventionally are integrally formed as a single chip on a semiconductor substrate. A low-voltage detection circuit is connected to the power supply circuit of the integrated microcomputer and nonvolatile memory to detect a low-voltage status of the power supply voltage VDD.

In this semiconductor device, in cases where it is configured that the entire system is reset when the low-voltage detection circuit detects a power supply voltage (VDD) drop, there is a drawback that it takes a significant amount of time to change the system back to the default setting.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a circuit or system for prevention of unintentional writing to a memory capable of assuredly preventing the memory from being written to unintentionally when a drop in power supply voltage occurs.

Among other potential advantages, some embodiments can provide a semiconductor device including a memory capable of assuredly preventing the memory from being written to unintentionally without resetting the entire device when a drop in power supply voltage occurs.

According to a first aspect of a preferred embodiment of the present invention, a circuit for prevention of unintentional writing to a memory, includes a detection circuit for performing a detection operation of a power supply voltage drop, the detection circuit being capable of being changed whether the detection operation is to be performed depending on a control signal from a control terminal, wherein a data input/output operation to a memory is also prohibited depending on an output signal of the detection circuit, and wherein the writing operation to the memory is prohibited depending on the control signal.

It is preferable that the circuit for prevention of unintentional writing to a memory further includes a register which registers the control signal, the register causes the detection circuit to perform the detection operation when the power supply voltage drops and the register is in a first state, and the data operation to the memory is prohibited by the output signal from the register when the power supply voltage is dropped and the register is in a second state.

It is preferable that the aforementioned circuit for prevention of unintentional writing to a memory further includes a first inverter connected between the register and the detection circuit and a second inverter to which the output signal of said register is to be inputted, wherein the first inverter and the second inverter have different threshold levels for determining ON/OFF states thereof.

According to a second aspect of the preferred embodiment of the present invention, a circuit for preventing unintentional writing to a memory includes a mode control register that controls operating states of said memory, said mode control register being resettable by a reset signal; a low-voltage detection circuit that detects a drop in power supply voltage and outputs a first reset signal to reset said mode control register, said low-voltage detection circuit being turned on and off by a standby control signal from a standby control register; and a standby control signal detecting circuit that detects a change in said standby control signal and outputs an operation prohibition signal to said mode control register to prevent an operation to said memory when said low-voltage detection circuit is turned off at the time of said drop in power supply voltage.

It is preferable that the aforementioned circuit for prevention of unintentional writing to a memory further includes a first inverter connected between the register and the detection circuit and a second inverter to which the output signal of the register is to be inputted, wherein the first inverter and the second inverter have different threshold levels for determining ON/OFF states thereof.

The aforementioned memory can be, e.g., a nonvolatile memory which requires a voltage above a certain level at the time of writing.

According to still another aspect of the preferred embodiment of the present invention, a semiconductor device is equipped with the aforementioned circuit for prevention of unintentional writing to a memory.

According to a still further aspect of the invention, a non-volatile memory system is provided with an unintentional writing prevention circuit.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by a way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
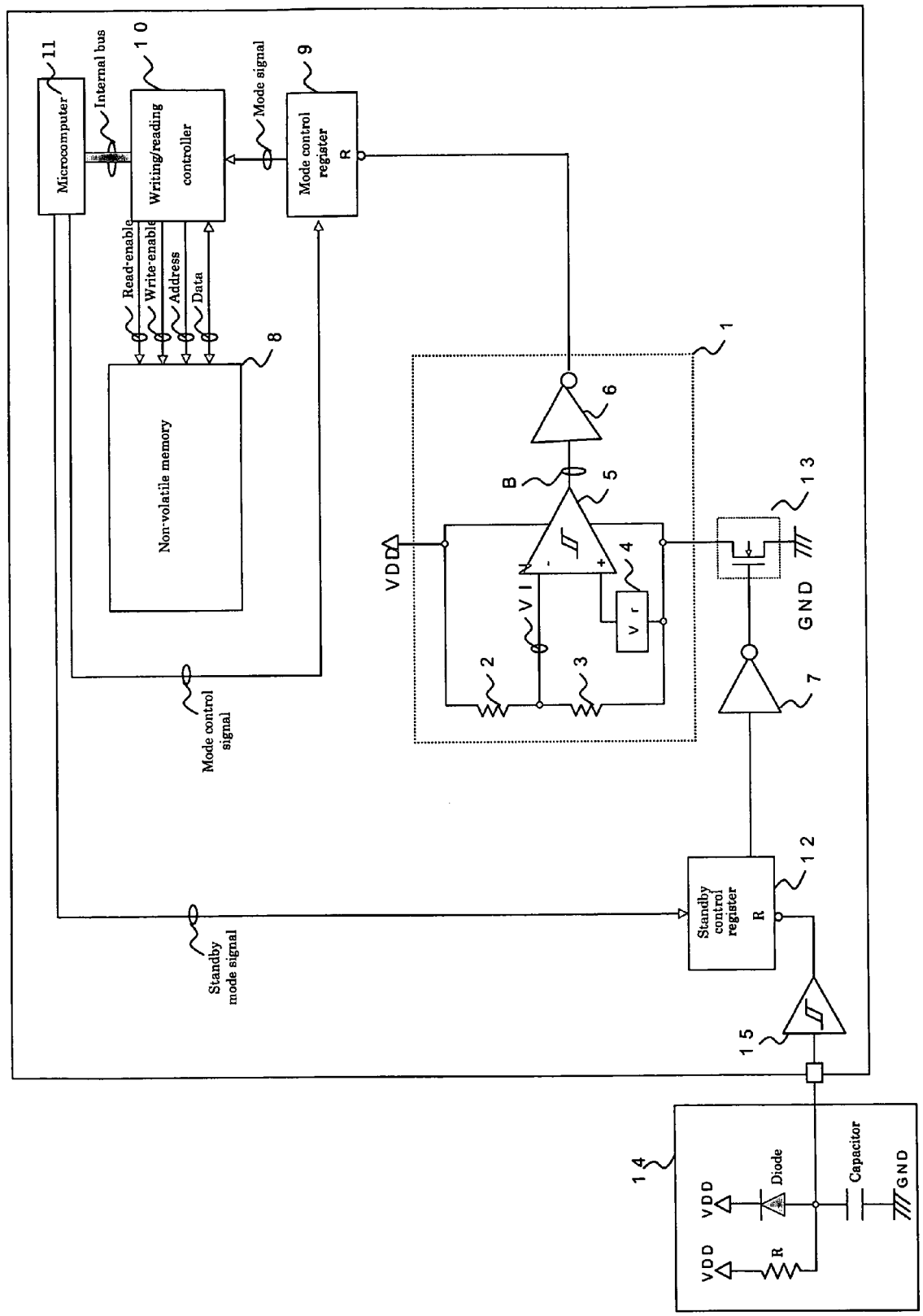
FIG. 1 is a block diagram showing a first embodiment of the present invention including an example circuit for prevention of unintentional writing to a memory.

FIG. 1 shows an example of a circuit for prevention of unintentional writing to a memory according to a first embodiment of the invention. Reference numeral "1" denotes a low-voltage detection circuit which detects a power supply voltage (VDD) drop, "2" and "3" denote resistances which divide the power supply voltage VDD, "4" denotes a reference voltage generating circuit which generates a reference value Vref as a voltage detection level, "5" denotes a comparator which compares the midpoint voltage of the resistance 2 and the resistance 3 with the reference voltage Vref, "6" denotes an inverter which inverts the output signal of the comparator 5, "7" denotes a second inverter, "8" denotes a nonvolatile memory, "9" denotes a mode control register which controls the setting of writing to and reading from the nonvolatile memory 8, and is reset by the output signal of the low-voltage detection circuit 1, "10" denotes a writing/reading controller which outputs a read-enable signal, a write-enable signal and an address signal and also performs inputting/outputting of data to the nonvolatile memory 8 based on the output signal of the mode control register 9. Reference numeral "11" denotes a microcomputer built in the chip, "12" denotes a standby control register which is reset by an external reset signal, "13" denotes a transistor which turns on or off the bias of the low-voltage detection circuit 1 in response to the control data of a standby mode, "14" denotes a common external reset circuit which is externally attached to an integrated circuit microcomputer, and "15" is a Schmidt-type buffer provided at the input stage.

In FIG. 1, in order to continuously detect a drop in the power supply voltage (VDD), it is always necessary to keep the low-voltage detection circuit 1 active in a mode other than the standby mode. As a result, in the active state, the low-voltage detection circuit 1 always consumes a certain amount of power.

When the power supply voltage VDD drops, the power supply voltage VDD is divided by the resistance 2 and the resistance 3 to be inputted to the inverting input terminal of the comparator 5. The divided midpoint voltage will be defined as VIN. The voltage VIN inputted to the inverting input terminal is compared to the reference voltage Vref inputted to the non-inverting input terminal of the comparator 5. When VIN>Vref, the output signal B from the comparator 5 will become a low logic level (hereinafter simply referred to as "L level"). On the other hand, in the case of VIN<Vref, the signal B will become a high logic level (hereinafter simply referred to as "H level"). The signal B is inputted into the inverter 6, where it is inverted. As a result, in the case of VIN>Vref, the output signal from the inverter 6 will be an "H" level. On the other hand, in the case of VIN<Vref, the output signal will be an "L" level. Thus, when a low-voltage is detected, an "L" active reset signal will be created.

The reset signal, i.e., an output signal of the low-voltage detection circuit 1, is inputted into the mode control register 9, and initializes the mode control register 9 when a low-voltage is detected. At the same time, the mode control register 9 initializes the operation mode of the writing/reading controller 10. When the power supply voltage VDD returns from the low-voltage state to the normal state, the output signal of the low-voltage detection circuit 1 changes from the "L" level to the "H" level, and therefore the mode control register 9 releases the initialized state of the operation mode of the writing/reading controller 10.

For example, if the power supply voltage VDD drops below the detection level during the writing of data into the nonvolatile memory 8, the low-voltage detection circuit 1 detects the low-voltage state and outputs a reset signal to the mode control register 9. Thus, the mode control register 9 is initialized, and at the same time the operation mode of the writing/reading controller 10 is also initialized. In this initialized state of the writing/reading controller 10, the writing of data to the memory 8 is interrupted. Thus, writing to the memory 8 is prevented at a low-voltage state, and therefore writing in a state where sufficient charges cannot flow into the floating gate of the nonvolatile memory 8 can be prevented.

When the power is first turned on, the standby control register 12 is set to a default "L" level by an initial reset signal received from an external reset circuit 14. In response, the control register 12 outputs an "L" level signal to the inverter 7. The "L" level is inverted by the inverter 7 into an "H" level and outputted to the transistor 13. Receiving this "H" level, the transistor 13 is turned on, thereby allowing a bias current to flow in the low-voltage detection circuit 1. As a result, the low-voltage detection circuit 1 becomes ready to detect a power supply voltage drop.

As will be understood from the above, in this embodiment, it is possible to prevent fatal unintentional writing to the nonvolatile memory 8 when a power supply voltage (VDD) drop occurs by simply controlling the writing/reading controller 10 via the mode control register 9 without resetting the entire system. This eliminates the needs of troublesome initial settings of the system after the restoration of the drop in power supply voltage.

When a standby mode is set to reduce the power consumption, a standby mode signal from the microcomputer 11 causes the standby control register 12 to output an "H" level. The "H" level from the standby register 12 is inverted into an "L" level by the inverter 7. Receiving the "L" level, the transistor 13 is turned off, and therefore the bias current in the low-voltage detection circuit 1 is blocked and does not flow, which results in a reduced power consumption. In this state, the low-voltage detection circuit 1 cannot detect a low-voltage state of the power supply VDD.

The low-voltage detection circuit 1 is generally configured to be controlled by the standby control register 12 in a programmable manner. A transitory power failure which causes the power supply voltage VDD to temporarily drop below the driving voltage Tr may occur due to noise.

While the embodiment of FIG. 1 in most cases works well, when the power supply voltage VDD is restored from the low-voltage state below the Tr driving voltage level, the capacitor in the external reset circuit 14 under some circumstances may not be fully discharged because the power supply voltage VDD may change faster than the discharge rate of the capacitor as determined by its time constant. As a result, the external reset circuit 14 may fail to output a reset signal to the standby control register 12 after such a transitory power failure.

Thus, when the power supply voltage VDD once drops below the Tr driving voltage and then is restored to the Tr driving voltage, the proper setting of the standby control register 12 becomes indefinite, with the result that the transistor 13 may fail to turn on. Thus, there is a possibility that the bias current will not be supplied to the low-voltage detection circuit 1. In this case, the turned-off state of the low-voltage detection circuit 1 would be maintained, and therefore the low-voltage detection circuit 1 would not be able to automatically generate a reset signal for the mode control register 9 by detecting the low-voltage status of the power supply VDD.

In this case, since the voltage of the mode control register 9 also has dropped below the Tr driving voltage, at the time of restoring the power supply to the Tr driving voltage, the state of the transistor is not established, which causes the setting of the mode control register 9 to be indefinite. As a result, the mode signal which defines the mode of the writing/reading controller 10 cannot be specified. For instance, where the mode of the writing/reading controller 10 was a read mode before the transitory power failure, it may be suddenly changed into a write mode after the restoration from the transitory power failure.

As mentioned above, in the case of a transitory power failure, if the external reset signal and the output signal of the low-voltage detection circuit 1 are not outputted, the mode control register 9 would not be reset. As a result, after the restoration from the transitory power failure, there is a possibility that the mode control register 9 would malfunction. Such malfunction of the mode control register 9 might cause unintentional writing of data to the nonvolatile memory 8 or unintentional erasing of data therefrom.

Figure 2:
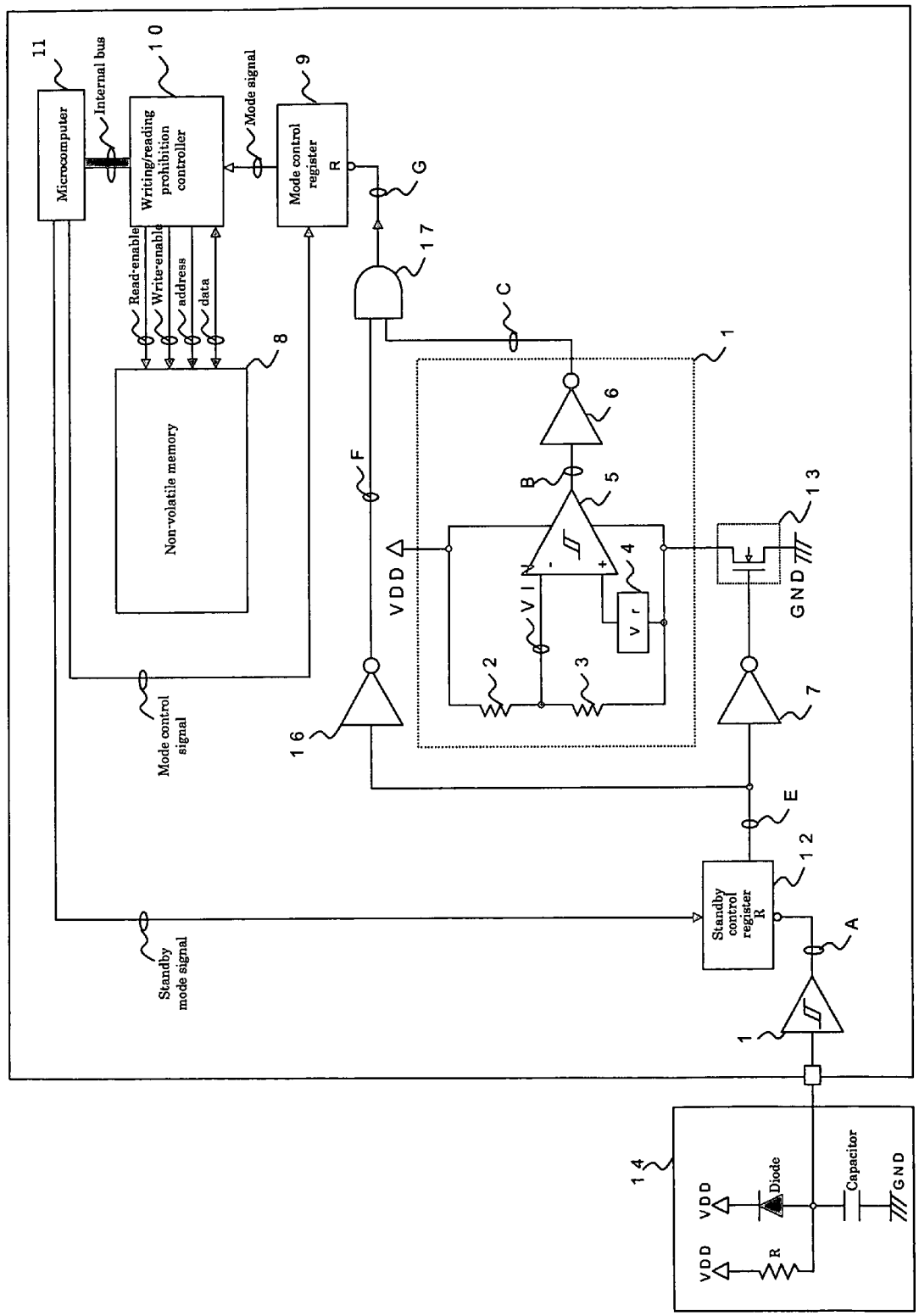
FIG. 2 is a block diagram showing a second embodiment of the present invention.

FIG. 2 is a block diagram showing a second, preferred embodiment of the present invention. This second embodiment is directed to the aforementioned possibility of less than optimal results of the first embodiment shown in FIG. 1.

In FIG. 2, the reference numeral "16" denotes an inverter connected to the signal line of the signal E which is the output signal from the standby control register 12, and "17" denotes an AND gate which produces a logical product of the signal C from the low-voltage detection circuit 1 and the signal F from the inverter 16. The explanation of the remaining portions in this circuit corresponding to the portions in the circuit shown in FIG. 1 by the same reference numerals will be omitted.

According to this embodiment, after a transitory power failure, even if the external reset circuit 14 and the low-voltage detection circuit 1 fail to operate properly, the signal F from the inverter 16 becomes active ("L" level) to thereby automatically reset the mode control register 9.

Figure 4:
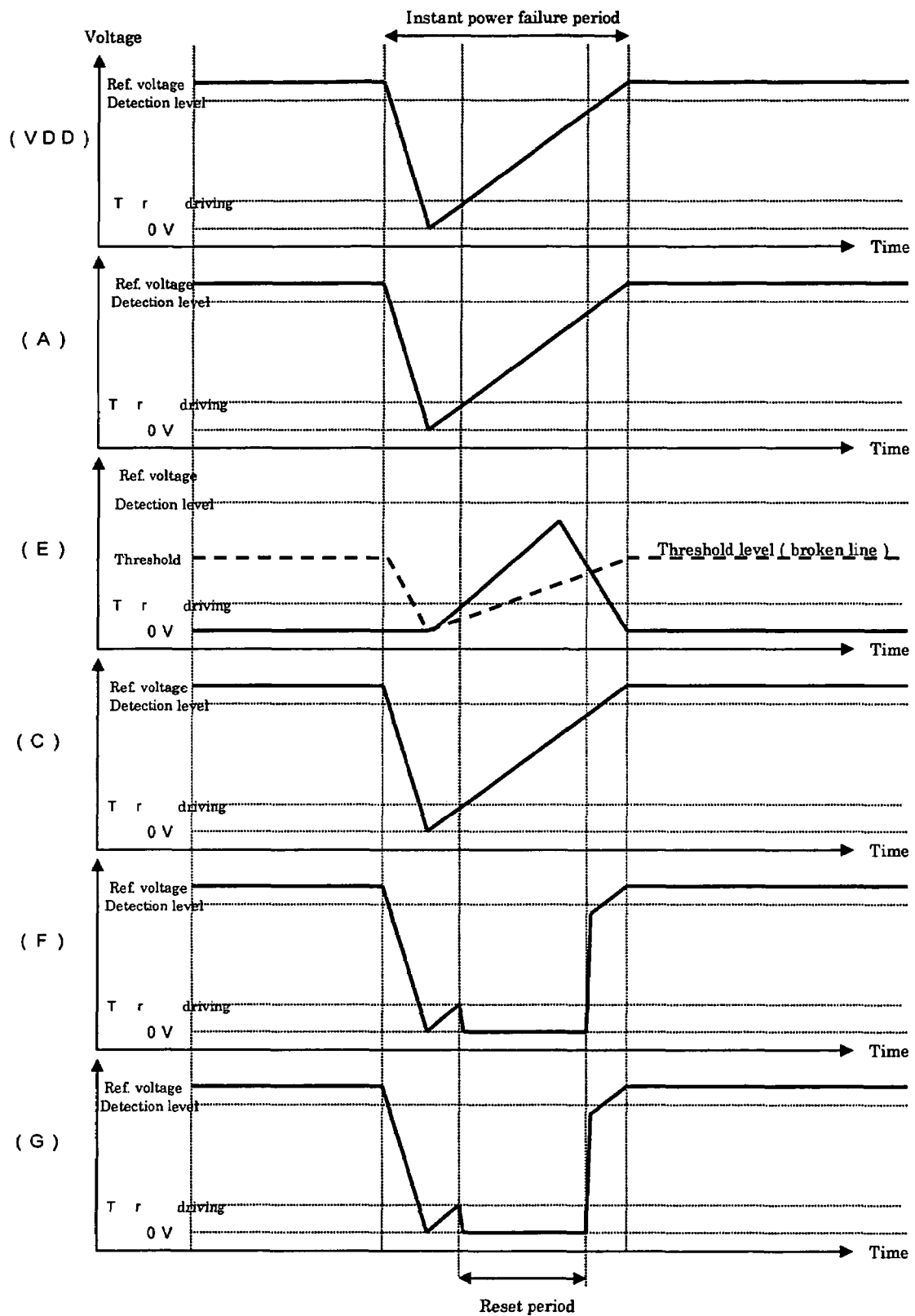
FIG. 4 is a timing chart explaining the operation of the embodiment shown in FIG. 2.

In the case where the power supply voltage VDD changes as shown in FIG. 4 (VDD) due to a transitory power failure, since the power supply voltage VDD drops below the Tr driving voltage, it is uncertain whether the output signal E from the standby control register 12 will be restored properly at the time of the restoration from the transitory power failure. For example, as shown in FIG. 4(E), the signal E may initially rise and then fall back to its previous level.

This is because there is a possibility that the signal A from the external reset circuit 14 will change with the power supply voltage VDD as shown in FIG. 4(A), due to the capacitor of the external reset circuit 14 not being able to discharge quickly enough because of its time constant, and therefore the reset operation cannot be executed.

Furthermore, there is a possibility that the signal C also will change with the power supply voltage VDD as shown in FIG. 4(C), since the bias current of the low-voltage detection circuit 1 is blocked and therefore the low-voltage detection circuit 1 cannot operate. The threshold level of the inverters 7 and 16 for discriminating "1" or "0" changes in proportion to the change in the power supply voltage VDD as shown by the broken line in FIG. 4(E).

On the other hand, the signal F rises with the restoration of the power supply voltage VDD until VDD reaches the Tr driving voltage level, and then signal F becomes an "L" level when the voltage level of the signal E reaches the Tr driving voltage. Thereafter, when the voltage level of the signal E falls back below the threshold level, the signal F is inverted into an "H" level, which releases the reset state of the mode control register 9. This change of the signal F is shown in FIG. 4(F). The signal F becomes an "L" level for a certain period during the transition of signal E outputted by the standby control register 12.

The signal G outputted by AND gate 17 is a reset signal for the mode control register 9 and changes in the same manner as the signal F when the signal F is in the "L" level as shown in FIG. 4(G) to initialize the mode control register 9. The mode control register 9 initializes the writing/reading controller 10. The initialized mode controller 10 thus can never cause an unintentional writing operation to the nonvolatile memory 8.

As will be apparent from the above, even in the situation in which a transitory power failure occurs and no reset signal is generated from the external reset circuit 14, a reset signal to the mode control register 9 will be outputted automatically since the signal F which is outputted from the inverter 16 becomes an "L" level. This prevents an unintentional writing operation to the nonvolatile memory 8.

Figure 5:
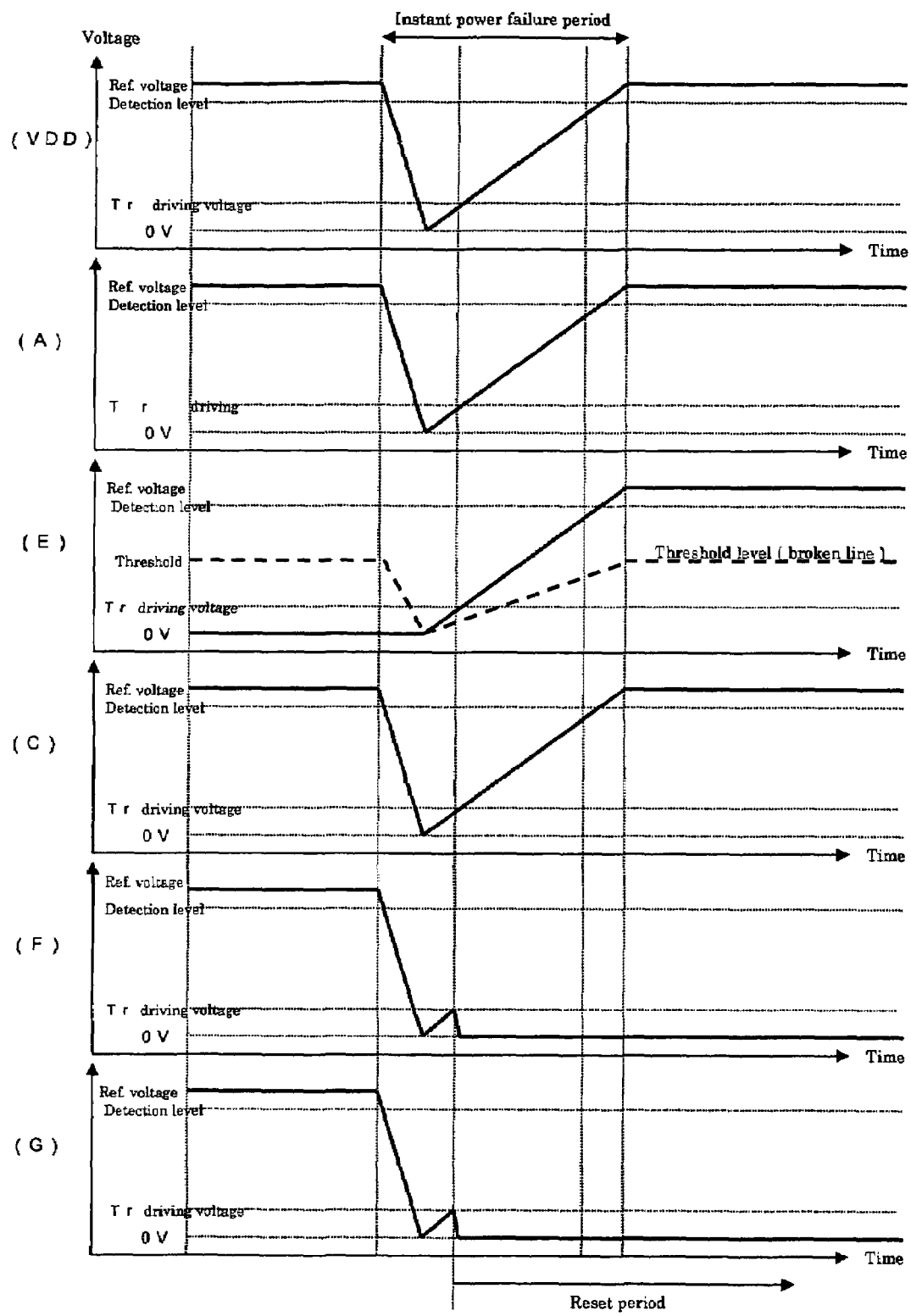
FIG. 5 is another timing chart explaining the operation of the embodiment shown in FIG. 2.

FIG. 5 shows the change of the power supply voltage VDD (see FIG. 5 (VDD)), the change of the signal A (see FIG. 5(A), the change of the signal E (see FIG. 5(E)), the change of the signal C (see FIG. 5(C)), the change of the signal F (see FIG. 5(F)), and the change of the signal G (see FIG. 5(G)) in the case where the signal E from the standby control register 12 (see FIG. 5(E)) does not fall after initially rising, in contrast to the situation shown in FIG. 4(E), but instead reaches the "H" level with the power supply voltage VDD.

When the voltage level of the signal E rises to the Tr driving voltage level, the signal F becomes an "L" level and the "L" level is maintained. The signal G, which is a reset signal for the mode control register 9, changes in the same manner as the signal F, and the "L" level is maintained by the AND gate 17.

As a result, the reset state of the nonvolatile memory 8 is maintained, and therefore the nonvolatile memory 8 cannot perform any operation, including writing and reading. In the situation where a reset signal is not generated normally, the value of the mode signal outputted from the mode control register 9 would be in an indefinite state depending upon whether the signal E was able to rise to the "H" level or not. Thus, by maintaining the reset status regardless of whether signal E rises to an "H" level during a transitory voltage drop of power supply VDD, it becomes possible to prevent fatal unintentional writing to the nonvolatile memory 8.

Therefore, power consumption can be reduced by employing the transistor 13, which performs a standby control by stopping bias current flow through detection circuit 1 when the overall system is in a standby mode. In addition to that, in a situation in which the power supply voltage VDD drops below the Tr driving voltage level by a transitory power failure and no reset signal A is issued by the external reset circuit 14, whether the output signal E from the standby control register 12 initially rises and then falls, or rises with the power supply voltage VDD, either a reset signal will be outputted to the mode control register 9, or a reset state will be held. Accordingly, an unintentional writing to the memory 8 can be prevented assuredly.

Figure 3:
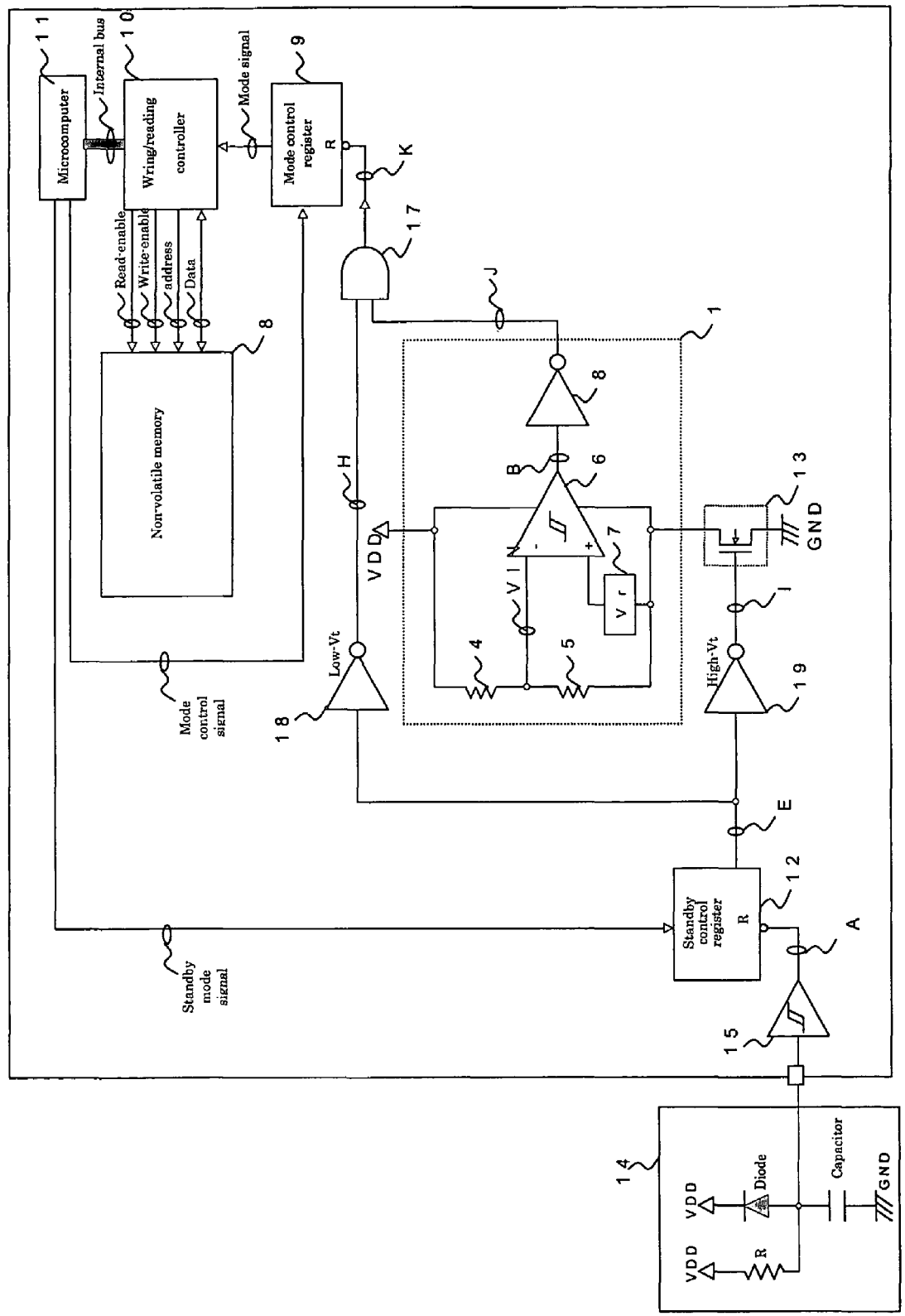
FIG. 3 is a block diagram showing a third embodiment of the present invention.

FIG. 3 is a block diagram showing a third, preferred embodiment of the present invention. This embodiment differs from the second embodiment shown in FIG. 2 in that the inverter 16 shown in FIG. 2 is replaced with a Low-Vt inverter 18 and that the inverter 7 shown in FIG. 2 is replaced with a High-Vt inverter 19. The aforementioned "Low-Vt" and "High-Vt" means a "low-threshold" and a "high-threshold," respectively.

The Low-Vt inverter 18 becomes an "L" level at a lower input voltage because of the low-threshold as compared with an inverter having a standard threshold. Accordingly, the signal H which is an output signal of the inverter 18 is more biased to becoming an "L" level as compared with an inverter having a standard threshold and therefore more frequently outputs a reset signal to mode control register 9.

The High-Vt inverter 19 would not become an "L" level until the input voltage becomes higher because of the high-threshold as compared with an inverter having a standard threshold. Accordingly, the signal I which is an output signal of the inverter 19 is more biased to an "H" level. When the signal I is an "H" level, the transistor 13 is turned on to allow a flow of the bias current through the detection circuit 1. The low-voltage detection circuit 1 therefore can more easily become ready to detect a low-voltage power supply condition as compared with an inverter having a standard threshold.

Figure 6:
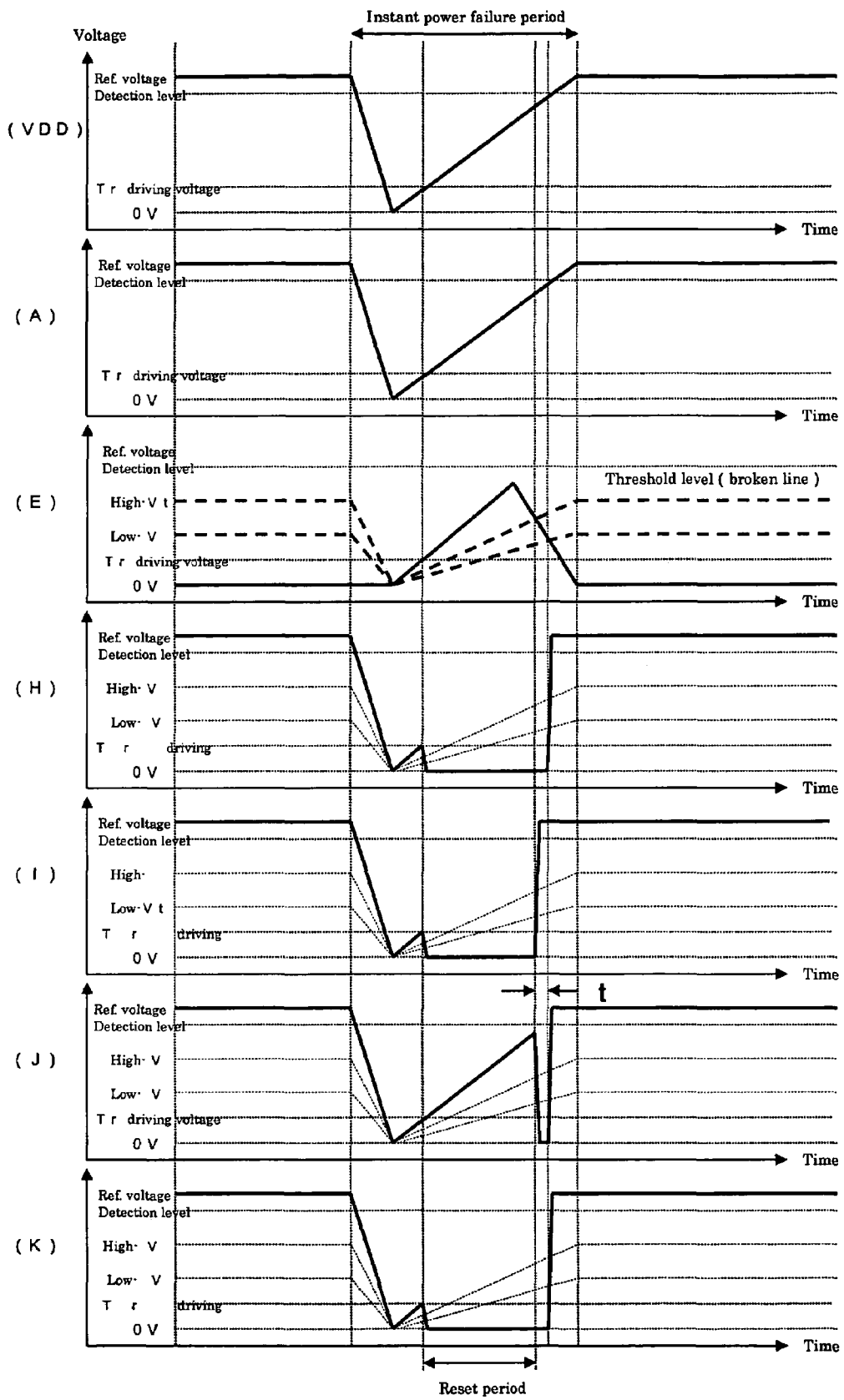
FIG. 6 is a timing chart explaining the operation of the embodiment shown in FIG. 3.

In the embodiment shown in FIG. 3, when the power-source voltage VDD changes as shown in FIG. 6(VDD) due to a transitory power failure, the signal E which is outputted by the standby control register 12 is in an unstable condition, and may sometimes change as shown in FIG. 6(E). The change of the power supply voltage VDD is shown in FIG. 6 (VDD), the change of the signal A is shown in FIG. 6(A), the change of the signal E is shown in FIG. 6(E), the change of the signal H is shown in FIG. 6(H), the change of the signal I is shown in FIG. 6(I), the change of the signal J is shown in FIG. 6(J) and the change of the signal K is shown in FIG. 6(K).

The Low-Vt and High-Vt threshold lines are shown in FIG. 6(E) by respective broken lines. The Low-Vt and High-Vt threshold lines change in proportion to the change in power supply voltage VDD.

When the voltage level of the signal E initially rises to the Tr driving voltage level, the signal H becomes an "L" level. Thereafter, when the voltage level of the signal E falls below the low-threshold level Low-Vt, the "L" level of the signal H is inverted into an "H" level to thereby release the reset status.

On the other hand, when the signal E falls below the High-Vt threshold line, the signal I becomes an "H" level to turn on the transistor 13 to thereby allow the flow of the bias current through the detection circuit 1. Thus, the low-voltage detection circuit 1 becomes ready to detect a low-voltage state of the power supply VDD.

The voltage level of the output signal J of the detection circuit 1 initially rises with the power supply voltage VDD as shown in FIG. 6(J). However, when the voltage level of the signal I changes to the "H" level, the low-voltage detection circuit 1 is activated, and the voltage level of the signal J immediately falls to the "L" level, such that the low-voltage detection circuit 1 outputs a reset signal. When the power-source voltage VDD continues to rise and exceeds the detection level, the voltage level of the signal J becomes an "H" level, which releases the reset status of the mode control register 9.

As shown in FIG. 6, since the low threshold and the high threshold levels Low-Vt and High-Vt are employed, a period "t" is created in which the reset signals overlap between the signal H and the signal J. The signal K is a logical product of the signals H and J, and therefore the signal K stabilizes when there is an overlapped reset period.

According to the aforementioned preferred embodiments, the bias current of the detection circuit 1 can be blocked during a system standby mode and an unintentional writing operation to the non-volatile memory can be prevented by generating a mode control register reset signal upon occurrence of a voltage drop in power supply voltage VDD regardless of the on/off status of the bias current of the low-voltage detection circuit 1, resulting in enhanced reliability against a transitory power failure due to noise.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

BROAD SCOPE OF THE INVENTION

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A circuit for prevention of unintentional writing to a memory, comprising:
   a detection circuit that detects a drop in power supply voltage and outputs a first reset signal in response thereto, said detection circuit being capable of being turned on and off by a control signal from a control terminal: and
   a control signal detecting circuit that detects a change in said control signal and outputs a second reset signal in response thereto;
   wherein a data input or output operation to said memory is prohibited in response to either said first reset signal or said second reset signal.

2. The circuit for prevention of unintentional writing to a memory as recited in claim 1, wherein said memory is a nonvolatile memory which requires a voltage above a certain level at the time of writing.

3. The circuit for prevention of unintentional writing to a memory as recited in claim 1, further comprising a register which registers and outputs the control signal.
   wherein said register turns on said detection circuit upon a drop in power supply voltage when said register is in a first state, and
   wherein a data input or output operation to said memory is prohibited by said control signal detecting circuit upon a drop in power supply voltage when said register is in a second state.

4. The circuit for prevention of unintentional writing to a memory as recited in claim 3, further comprising a first inverter connected between said register and said detection circuit and a second inverter to which said control signal of said register is to be inputted, said second inverter being part of said control signal detecting circuit,
   wherein said first inverter and said second inverter have different threshold levels for determining ON/OFF states thereof.

5. The circuit for prevention of unintentional writing to a memory as recited in claim 4, further comprising a mode control register that controls operating status of said memory. said mode control register being resettable by either said first reset signal or said second reset signal.

6. The circuit for prevention of unintentional writing to a memory as recited in claim 5, further comprising a read/write controller that outputs a read-enable signal, a write-enable signal and an address signal and also performs inputting/outputting of data to said memory based on an output signal of said mode control register.

7. The circuit for prevention of unintentional writing to a memory as recited in claim 6, wherein said memory is a nonvolatile memory which requires a voltage above a certain level at the time of writing.

8. A circuit for prevention of unintentional writing to a memory, comprising;
   a mode control register that controls data input/output operating states of said memory, said mode control register being resettable by a reset signal;
   a low-voltage detection circuit that detects a drop in power supply voltage and outputs a first reset signal to reset said mode control register, said low-voltage detection circuit being turned on and off by a standby control signal from a standby control register; and
   a standby control signal detecting circuit that detects a change in said standby control signal and outputs an operation prohibition signal to said mode control register to prevent a data input or output operation to said memory when said low-voltage detection circuit is turned off at the time of said drop in power supply voltage.

9. The circuit for prevention of unintentional writing to a memory as recited in claim 8, wherein said memory is a nonvolatile memory which requires a voltage above a certain level at the time of writing.

10. The circuit for prevention of unintentional writing to a memory as recited in claim 8, further comprising a first inverter connected between said standby control register and said low-voltage detection circuit and a second inverter to which said operation prohibition signal is to be inputted, said second inverter being part of said standby control signal detecting circuit.
    wherein said first inverter and said second inverter have different threshold levels for determining ON/OFF states thereof.

11. The circuit for prevention of unintentional writing to a memory as recited in claim 8, further comprising a writing/reading controller that outputs a read-enable signal, a write-enable signal and an address signal and also performs inputting/outputting of data to said memory based on an output signal of said mode control register.

12. The circuit for prevention of unintentional writing to a memory as recited in claim 8, further comprising:

a first inverter connected between said standby control register and said low-voltage detection circuit and a second inverter to which said operation prohibition signal is to be inputted, said second inverter being pad of said standby control signal detecting circuit, and said first inverter and said second inverter having different threshold levels for determining ON/OFF states thereof; and a writing/reading controller that outputs a read-enable signal, a write-enable signal and an address signal and also performs inputting/outputting of data to said memory based on an output signal of said mode control register, wherein said memory is a nonvolatile memory which requires a voltage above a certain level at the time of writing.

13. A semiconductor device equipped with said circuit for prevention of unintentional writing to said memory as recited in claim 1.

14. The semiconductor device equipped with said circuit for prevention of unintentional writing to said memory as recited in claim 13, further comprising a microcomputer, wherein said microcomputer, said detection circuit, said control signal detecting circuit and said memory are integrally formed as a single chip on a semiconductor substrate.

15. A circuit for preventing unintentional writing to a memory, comprising:

a memory that is capable of receiving data to be stored in a writing operation. and of outputting stored data n a reading operation;

a memory operation mode controller for controlling an operational mode of said memory, said memory operation mode controller being resettable to a default state in response to receipt of a reset signal; and a low-voltage detection circuit for detecting a drop in voltage level of a power supply voltage, and for outputting the reset signal to said memory operation mode controller in response to detection of said drop in voltage.

16. The circuit for prevention of unintentional writing to a memory as recited in claim 15, wherein said memory is a nonvolatile memory which requires a voltage above a certain level at the time of writing.

17. The circuit for prevention of unintentional writing to a memory as recited in claim 15, wherein said low-voltage detection circuit is capable of being turned on and off by a control signal from a control terminal.

18. The circuit for prevention of unintentional writing to a memory as recited in claim 15, wherein said memory operation mode controller includes a mode control register that controls operating status of said memory, said mode control register being resettable by said reset signal, and a writing/reading controller that outputs a read-enable signal, a write-enable signal and an address signal and also performs inputting/outputting of data to said memory based on an output signal of said mode control register.

19. The circuit for prevention of unintentional writing to a memory as recited in claim 15, wherein said memory is a nonvolatile memory which requires a voltage above a certain level at the time of writing.

20. A non-volatile memory system, comprising:

a non-volatile memory for storing data received in a writing operation. and for reading out stored data in a reading operation:

a mode control register for controlling an operational mode of said non-volatile memory to enable data writing or data reading operations;

a low-voltage detection circuit that detects a drop in power supply voltage level, and outputs a reset signal to said mode control register to reset an operational mode of said non-volatile memory when a drop in power supply voltage has been detected, said low-voltage detection circuit being turned on and off by a control signal from a standby control terminal;

a writing prevention circuit that prevents said mode control register from enabling a writing operation to said non-volatile memory when a drop in power supply voltage occurs while said low-voltage detection circuit is turned off.

* * * * *